United States Patent
Chen et al.

(10) Patent No.: US 8,760,953 B2
(45) Date of Patent: Jun. 24, 2014

(54) SENSE AMPLIFIER WITH SELECTIVELY POWERED INVERTER

(75) Inventors: Nan Chen, San Diego, CA (US); Zhiqin Chen, San Diego, CA (US); Ritu Chaba, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 331 days.

(21) Appl. No.: 12/895,896

(22) Filed: Oct. 1, 2010

(65) Prior Publication Data

US 2012/0082174 A1     Apr. 5, 2012

(51) Int. Cl.
  *G11C 11/4091*    (2006.01)
  *G11C 16/28*    (2006.01)
  *G11C 11/412*    (2006.01)

(52) U.S. Cl.
  USPC ...... 365/207; 365/205; 365/185.21; 365/154; 365/156

(58) Field of Classification Search
  USPC ............. 365/230, 55, 203, 530, 207, 205, 365/185.21, 154, 156; 370/211, 532, 538, 370/540; 29/832
  See application file for complete search history.

(56) References Cited

U.S. PATENT DOCUMENTS

| | | | |
|---|---|---|---|
| 4,843,264 A * | 6/1989 | Galbraith | 327/55 |
| 4,973,864 A * | 11/1990 | Nogami | 327/55 |
| 5,017,815 A | 5/1991 | Shah et al. | |
| 5,391,949 A | 2/1995 | Vinal | |
| 5,539,691 A | 7/1996 | Kozaru et al. | |
| 6,031,776 A * | 2/2000 | Chen et al. | 365/205 |
| 6,971,160 B1 * | 12/2005 | Welch et al. | 29/832 |
| 7,061,793 B2 | 6/2006 | Barth, Jr. et al. | |
| 7,590,017 B2 * | 9/2009 | Romanovskyy et al. | 365/203 |
| 7,616,513 B1 | 11/2009 | Peng et al. | |
| 8,305,815 B2 * | 11/2012 | La Rosa | 365/185.21 |
| 8,363,499 B2 * | 1/2013 | La Rosa | 365/207 |
| 2004/0130926 A1 | 7/2004 | Nakase | |
| 2006/0023614 A1 | 2/2006 | Lawson et al. | |
| 2007/0268764 A1 | 11/2007 | Kim et al. | |
| 2011/0110174 A1 * | 5/2011 | Cho et al. | 365/194 |

FOREIGN PATENT DOCUMENTS

| | | |
|---|---|---|
| EP | 0865043 A2 | 9/1998 |
| JP | H0574172 A | 3/1993 |
| JP | H0574175 A | 3/1993 |
| JP | 8007573 A | 1/1996 |
| JP | H10255480 A | 9/1998 |
| JP | 2010218649 A | 9/2010 |

OTHER PUBLICATIONS

International Search Report and Written Opinion—PCT/US2011/054550—ISA/EPO—Feb. 8, 2012.

* cited by examiner

*Primary Examiner* — Helal A Algahaim
*Assistant Examiner* — Mahmoud Ismail
(74) *Attorney, Agent, or Firm* — Sam Talpalatsky; Nicholas J. Pauley; Joseph Agusta (57) ABSTRACT

A sense amplifier includes a first inverter responsive to a first output of a latch. The first inverter is powered by a sense enable signal. The sense amplifier also includes a second inverter responsive to a second output of the latch. The second inverter is also powered by the sense enable signal.

42 Claims, 6 Drawing Sheets

United States Patent
US 8,760,953 B2

SENSE AMPLIFIER WITH SELECTIVELY POWERED INVERTER

FIELD OF THE DISCLOSURE

The present disclosure is generally related to a sense amplifier.

BACKGROUND

Sense amplifiers may be used to read data stored in semiconductor memory devices such as static random access memory (SRAM) devices. Two types of sense amplifiers include current-latched sense amplifiers and voltage-latched sense amplifiers. As compared to current-latched sense amplifiers, voltage-latched sense amplifiers may use smaller input signals, exhibit faster operation, and use less power. Semiconductor memory device performance may be enhanced by a sense amplifier that provides improved switching speed and reduced leakage when set from a selected or enabled state to a non-selected or disabled state.

SUMMARY

A sense amplifier may include a latch and two inverters. The sense amplifier may receive data signals via a bit line pair and may receive a sense enable signal. The inverters may generate an output of the sense amplifier and may be powered by the sense enable signal. Powering the inverters with the sense enable signal may inhibit an undesired output from the sense amplifier when the sense enable signal indicates the sense amplifier is in a disable state.

In a particular embodiment, a sense amplifier includes a first inverter responsive to a first output of a latch. The first inverter is powered by a sense enable signal. The sense amplifier also includes a second inverter responsive to a second output of the latch. The second inverter is also powered by the sense enable signal.

In a particular embodiment, a method includes selectively powering a first inverter and a second inverter of a sense amplifier by providing a sense enable signal to the first inverter and to the second inverter. The method may include sending the sense enable signal to an isolation device coupled to a bit line to isolate the first inverter from the bit line when the sense enable signal powers the first inverter and the second inverter. The method may also include inhibiting output from the first inverter when the sense enable signal does not power the first inverter and the second inverter.

In a particular embodiment, an apparatus includes a first sense amplifier including a first inverter and a second inverter. The first inverter and the second inverter are selectively powered based on a first sense enable signal received at the first sense amplifier. The apparatus also includes a second sense amplifier including a third inverter and a fourth inverter. The third inverter and the fourth inverter are selectively powered based on a second sense enable signal received at the second sense amplifier.

One particular advantage provided by at least one of the disclosed embodiments is that selectively powering inverters based on a sense enable signal can prevent erroneous signals from being output by a non-enabled sense amplifier using a circuit that has fewer devices and a faster switching speed as compared to a circuit that uses devices such as logic gates to control an input to an output inverter. Other aspects, advantages, and features of the present disclosure will become apparent after review of the entire application, including the following sections: Brief Description of the Drawings, Detailed Description, and the Claims.

DETAILED DESCRIPTION

Figure 1:
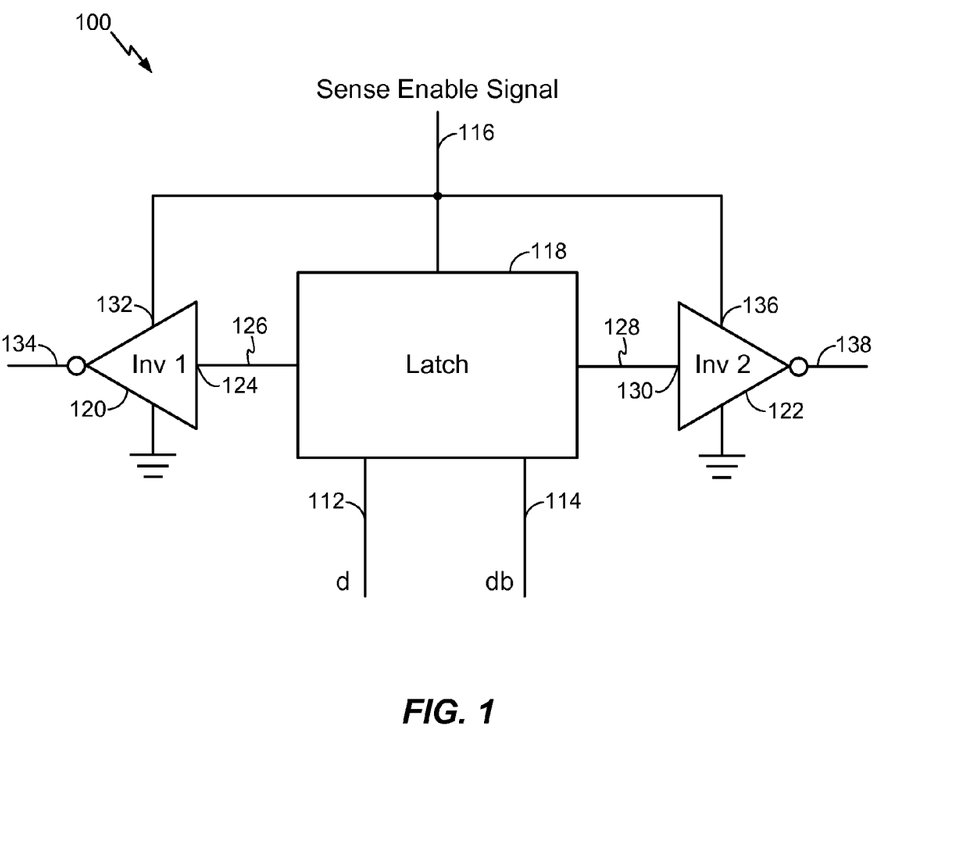
FIG. 1 is a diagram of an embodiment of a sense amplifier with a selectively powered inverter.

FIG. 1 shows an embodiment of a sense amplifier 100 with a selectively powered inverter. The sense amplifier 100 may be a voltage-latched sense amplifier. The sense amplifier 100 may be implemented in a 28 nanometer static random access memory (SRAM) design, as an illustrative example. The sense amplifier 100 may receive a bit line pair 112, 114 and a sense enable signal 116 as inputs. The bit line pair 112, 114 may be output from a core array of memory cells. The sense enable signal 116 may indicate either an enable state or a disable state. The sense enable signal 116 may have a high voltage or logical "1" value when in the enable state, and the sense enable signal 116 may have a low voltage or logical "0" value when in the disable state.

The sense amplifier 100 may include a latch 118, a first inverter 120, and a second inverter 122. The latch 118 may receive the bit line pair 112, 114 and the sense enable signal 116. When the latch 118 is activated by the sense enable signal 116, the latch 118 may be responsive to a differential voltage between a data signal (d) at the bit line 112 and a complementary data signal (db) at the bit line 114. The latch 118 may transition to an internal state that corresponds to the differential voltage received via the bit line pair 112, 114, such as by setting a voltage at an internal node in response to the differential voltage. An inverter input 124 of the first inverter 120 receives a first latch output 126 of the latch 118 when the latch 118 is activated by the sense enable signal 116. The latch may also send a second latch output 128 to an inverter input 130 of the second inverter 122 when the latch 118 is activated by the sense enable signal 116.

The first inverter 120 is powered by the sense enable signal 116 received at a supply input 132 of the first inverter 120. When the sense enable signal 116 is in the enable state, a first output 134 is a logical complement of the first latch output 126. When the sense enable signal 116 is in the disable state, the sense enable signal 116 does not activate the first inverter 120 or the latch 118. Even when a current sufficient to activate the first inverter 120 flows to the first inverter 120 from the bit line 112, when the sense enable signal 116 is in the disable state, the first inverter 120 is not activated by the sense enable signal 116 and generates an output that is independent of a voltage at the first latch output 126 (e.g. generates a logical low output voltage). As a result, the first inverter 120 is inhibited from generating an erroneous signal when the sense enable signal 116 is in the disable state.

The second inverter 122 is powered by the sense enable signal 116 received at a supply input 136 of the second inverter 122. When the sense enable signal 116 is in the enable state, a second output 138 is a logical complement of the second latch output 128. When the sense enable signal 116 is in the disable state, the sense enable signal 116 does not activate the second inverter 122 or the latch 118. In the disable state, an output is provided at the second output 138 that is independent of a voltage at the second latch output 128 (e.g. a logical low output voltage) even when a current sufficient to activate the second inverter 122 flows to the second inverter 122 from the bit line 114 because the second inverter 122 is not activated by the sense enable signal 116. The second inverter 122 is inhibited from generating an erroneous signal when the sense enable signal 116 is in the disable state.

The first inverter 120 and the second inverter 122 are selectively powered based on the sense enable signal 116 to prevent the first inverter 120 and the second inverter 122 from driving the first output 134 and the second output 138 when the sense amplifier 100 is disabled. By powering off the first inverter 120 and second inverter 122 when the sense amplifier 100 is disabled, the first output 134 and the second output 138 may be used as part of a multiplexer output without introducing contention.

When the sense amplifier 100 is activated by the sense enable signal 116, the sense amplifier 100 provides the first output 134 via the first inverter 120 and the second output 138 via the second inverter 122. The first output 134 and the second output 138 may be sent to output devices, such as n-type transistors (e.g., n-type metal-oxide-semiconductor (NMOS) transistors). The first output 134 may be coupled with first outputs of other sense amplifiers as a first multiplexor out line. The second output 138 may be coupled with second outputs of other sense amplifiers as a second multiplexor out line, as described with respect to FIG. 2.

During operation, when the sense enable signal 116 is in the disable state, the latch 118 is deactivated, the first inverter 120 is powered off, and the second inverter 122 is powered off. The first output 134 and the second output 138 have a logical low voltage. When the sense enable signal 116 is in the enable state, the latch 118 is activated and provides the first latch output 126 to the first inverter 120 and the second latch output 128 to the second inverter 122, where the latch outputs 126, 128 are based on data values of the bit lines 112, 114. The first inverter 120 outputs the first output 134 and the second inverter 122 outputs the second output 138.

By powering the first inverter 120 and the second inverter 122 with the sense enable signal 116, the sense amplifier 100 is able to be small, fast, and reliable. For example, powering the first inverter 120 and the second inverter 122 with the sense enable signal 116 may avoid the need for additional devices (e.g., NOR gates) to inhibit erroneous signals from being output by the sense amplifier 100. Using fewer devices in the output path may result in better performance, less coupling noise, better mismatch, and a smaller area for the sense amplifier 100.

Figure 2:
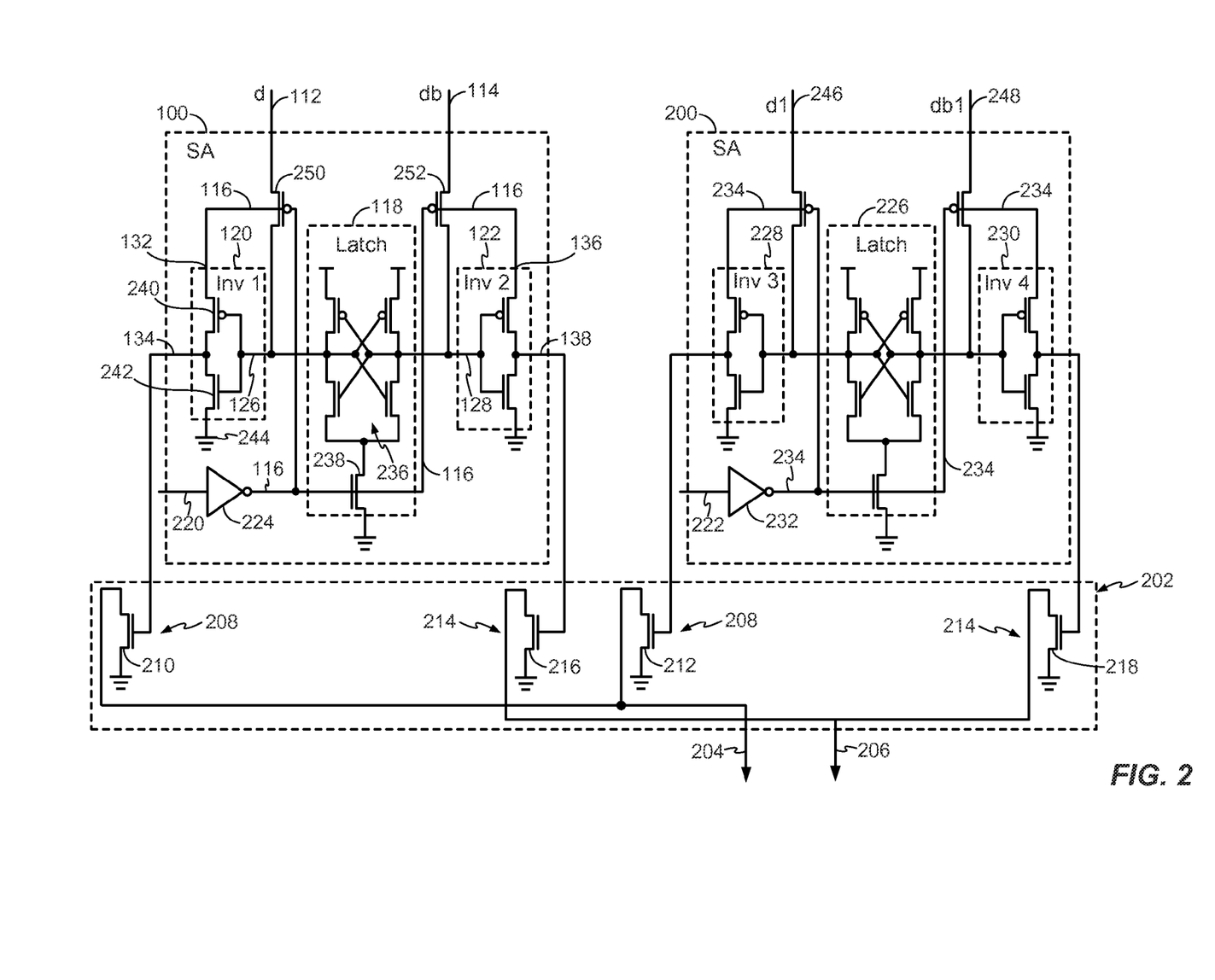
FIG. 2 is a schematic diagram of an embodiment of a pair of sense amplifiers with selectively powered inverters coupled to provide outputs to a multiplexor.
Figure 3:
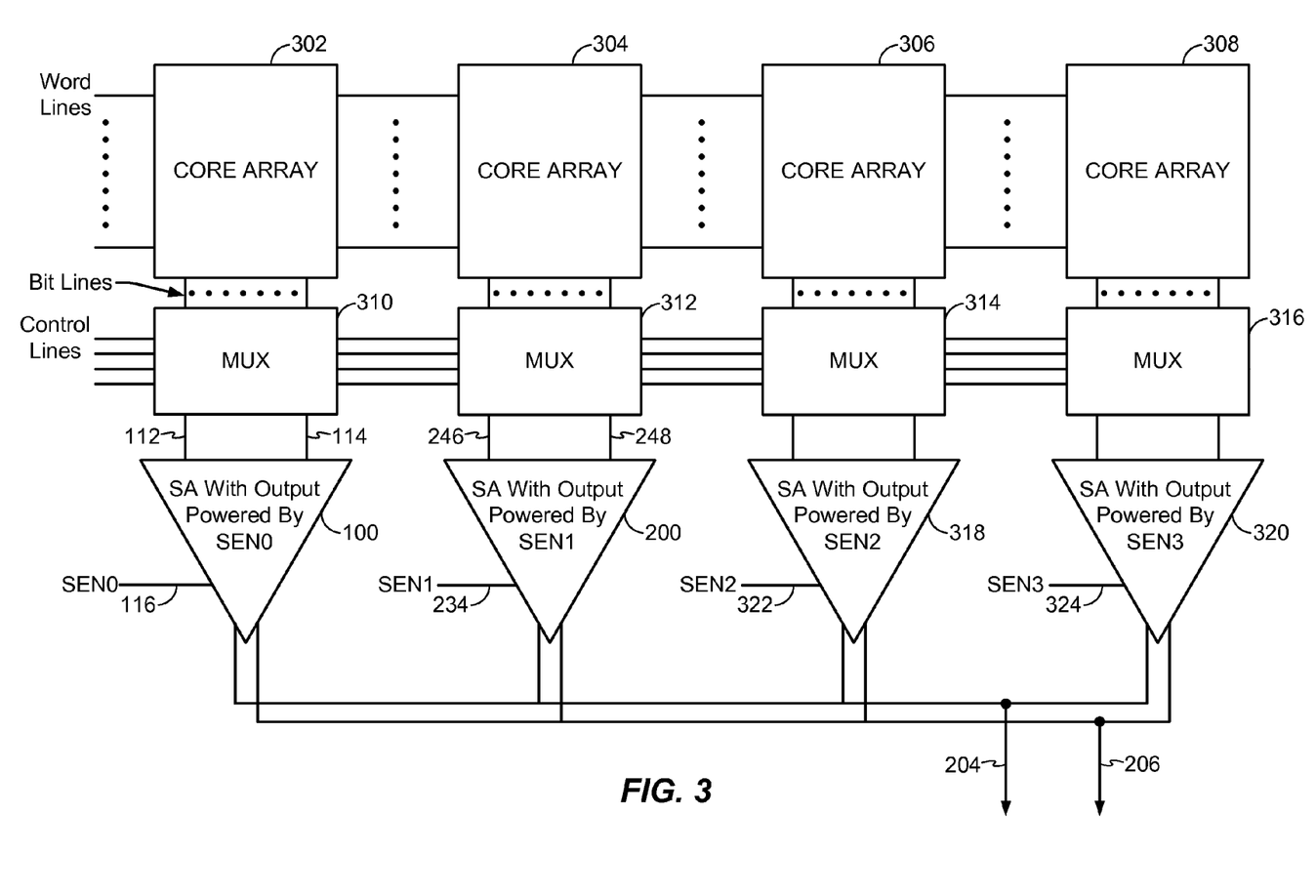
FIG. 3 is a schematic diagram of an embodiment of the sense amplifier of FIG. 1 implemented in a 16 to 1 multiplex scheme in a static random access memory (SRAM) design.

FIG. 2 shows an illustrative embodiment of the first sense amplifier (SA) 100 and a second sense amplifier (SA) 200 whose outputs are coupled to an output stage 202 having a first multiplexor (MUX) out line 204 and a second MUX out line 206. The output stage 202 may include a first multiplexor 208 that includes a first output device 210 from the first sense amplifier 100 and a first output device 212 from the second sense amplifier 200. The output stage 202 may also include a second multiplexor 214 that includes a second output device 216 from the first sense amplifier 100 and a second output device 218 from the second sense amplifier 200. The first multiplexor 208 and the second multiplexor 214 may send outputs to the multiplexor out lines 204, 206 in response to the first sense amplifier 100 receiving an initial sense enable signal 220 and the second sense amplifier 200 receiving an initial sense enable signal 222. The output stage 202 may receive outputs from at least one additional sense amplifier. Additional sense amplifiers may be coupled to the MUX output lines 204, 206, as depicted in FIG. 3. Because the output stage 202 is controlled by selectively powering off inverters of a non-selected sense amplifier, such as the inverters 120, 122, without use of a not-OR (NOR) circuit or other logic gate that introduces a delay in order to reduce contention from multiple sense amplifiers providing signals to a common output, enhanced speed and contention-free operation may be provided.

The first sense amplifier 100 and the second sense amplifier 200 may be voltage-latched sense amplifiers. The first sense amplifier 100 may include a latch 118, a first inverter 120, a second inverter 122, and an input signal inverter 224. The first inverter 120 and the second inverter 122 are selectively powered based on the first sense enable signal 116. To illustrate, power is not supplied to the first inverter 120 or to the second inverter 122 when the first sense enable signal 116 indicates a disable state. Power is supplied to the first inverter 120 of the first sense amplifier 100 and to the second inverter 122 of the first sense amplifier 100 when the first sense enable signal 116 indicates an enable state. Similarly, the second sense amplifier 200 may include a latch 226, a third inverter 228, a fourth inverter 230, and an input signal inverter 232. The third inverter 228 and the fourth inverter 230 are selectively powered based on a second sense enable signal 234.

The latch 118 may include a pair of cross coupled inverters 236 and a pull down device 238. The pull down device 238 of the first sense amplifier 100 may be controlled by the sense enable signal 116. Similarly, latch 226 may include a pair of cross coupled inverters and a pull down device. The pull down device of the second sense amplifier 200 may be controlled by the sense enable signal 234.

Each of the inverters 120, 122, 228, and 230 may include a p-type transistor and an n-type transistor serially coupled between a supply input and a ground. For example, the first inverter 120 includes a p-type transistor 240 and an n-type transistor 242 serially coupled between the first supply input 132 and a ground 244. For each of the inverters 120, 122, 228, and 230, the p-type transistor, the n-type transistor, or both may be low threshold voltage (LVT) devices. For example, each of the inverters 120, 122, 228, and 230 may include a plurality of LVT devices. A LVT device in a particular inverter of a particular sense amplifier may exhibit faster switching than a non-LVT device but may be more susceptible to voltage leakage when the corresponding sense amplifier is in a standby mode (e.g., when the sense amplifier receives a sense enable signal having a disable state). Because no power is applied to the particular inverter when the sense enable signal is in the disable state, the particular inverter is set to ground. As a result, an output device (e.g., one of output devices 210, 212, 216, or 218) that receives output from the particular inverter (e.g., one of inverters 120, 122, 228, or 230) is held in a high-impedance state, even when a relatively large voltage differential is received at a bit line pair for the particular sense amplifier (e.g., the bit line pair 112, 114 for the first sense amplifier 100 or a bit line pair 246, 248 for the second sense amplifier 200).

The first sense amplifier 100 may receive the initial sense enable signal 220 and the bit line pair 112, 114 as inputs. The initial sense enable signal 220 may be provided to the input signal inverter 224 to produce the sense enable signal 116. In other embodiments, the first sense amplifier 100 may not include the input signal inverter 224 and the initial sense enable signal 220 is the sense enable signal 116. The sense enable signal 116 may be coupled to a control terminal of the pull down device 238, to the supply input 132 of the first inverter 120, and to the supply input 136 of the second inverter 122. The first sense amplifier 100 may be configured to provide the output 134 of the first inverter 120 to the multiplexor 208 and to provide the output 138 of the second inverter 122 to the multiplexor 214 in response to receiving the sense enable signal 116. The sense enable signal 116 may also be used to control a first isolation device 250 and a second isolation device 252.

The first isolation device 250 and the second isolation device 252 isolate signals at the bit lines 112, 114 from the latch 118, the first inverter 120, and the second inverter 122. The first isolation device 250 and the second isolation device 252 may be p-type transistors (e.g., p-type metal-oxide-semiconductor (PMOS) transistors) that are controlled by the sense enable signal 116. The isolation devices 250, 252 isolate the inverters 120, 122 from the bit lines 112, 114 when the inverters 120, 122 are powered by the sense enable signal 116 to prevent signals at the bit lines 112, 114 from interfering with the latch outputs 126, 128. Outputs of the first isolation device 250 and the second isolation device 252 may be provided to the latch 118.

When the sense enable signal 116 activates the latch 118 via the pull down device 238, the latch 118 may be responsive to a differential bias provided by the bit lines 112, 114 to enter a state so that a value for the first latch output 126 corresponds to a value of the bit line 112 and a value for the second latch output 128 corresponds to a value of the bit line 114. The latch outputs 126, 128 from the latch 118 pass to the first inverter 120 and the second inverter 122 to control output to the MUX out lines 204, 206 via the first output device 210 and the second output device 216.

When the sense enable signal 116 is in the enable state, the sense enable signal 116 powers the first inverter 120 and the second inverter 122. The first output 134 from the first inverter 120 drives the first output device 210 to provide a ground signal or a high-impedance output to the MUX out line 204. The second output 138 from the second inverter 122 drives the second output device 216 to provide a ground signal or a high-impedance output to the MUX out line 206. For example, the MUX out lines 204, 206 may be pre-charged to a logical "1" value and may be maintained at the logical "1" value by the high-impedance output or discharged to ground to generate a logical "0" value.

The second sense amplifier 200 may receive the initial sense enable signal 222 and bit line pair 246, 248 as inputs. The initial sense enable signal 222 may be provided to the input signal inverter 232 to produce the sense enable signal 234. The sense enable signal 234 may have an opposite state as the sense enable signal 116 so that the MUX out lines 204, 206 are responsive to a single sense amplifier (e.g., either first sense amplifier 100 or second sense amplifier 200).

When the sense enable signal 116 is in the enable state, the sense enable signal 234 is in the disable state. The MUX out line 204 receives a signal (e.g., ground or high-impedance (high-Z)) from the first output device 210 associated with the first sense amplifier 100 and the MUX out line 206 receives a signal (e.g., high-Z or ground) from the second output device 216 associated with the first sense amplifier 100. The MUX out lines 204, 206 are isolated from the second sense amplifier 200 because the output devices 212, 218 associated with the second sense amplifier 200 are held in a high-Z state. In particular, powering off the inverters 228, 230 of the second sense amplifier 200 causes the output devices 212, 218 of the second sense amplifier 200 to receive a logical low voltage and maintain a high-Z state.

When the sense enable signal 116 is in the disable state, the sense enable signal 234 is in the enable state. The MUX out line 204 receives a signal from the first output device 212 associated with the second sense amplifier 200 and the MUX out line 206 receives a signal from the second output device 218 associated with the second sense amplifier 200. The MUX out lines 204, 206 do not receive inputs from the first output device 210 and the second output device 216 associated with the first sense amplifier 100 because the output devices 210, 216 associated with the first sense amplifier 100 are held at the high-Z state in response to the inverters 120, 122 of the first sense amplifier 100 being powered off.

Using the sense enable signal 116 to selectively power the inverters 120, 122 of the first sense amplifier 100 and the sense enable signal 234 to selectively power the inverters 228, 230 of the second sense amplifier 200 may allow a selected sense amplifier (e.g., sense amplifier 100 or 200) to quickly and reliable respond to a voltage difference between input bit line pairs (e.g., 112-114 or 246-248) without allowing erroneous signals to be output from a non-selected or disabled sense amplifier (i.e., prevent erroneous signals from sense amplifier 100 when the selected sense amplifier is sense amplifier 200 and prevent erroneous signals from sense amplifier 200 when the selected sense amplifier is sense amplifier 100).

FIG. 3 depicts an embodiment of the sense amplifier 100 and the sense amplifier 200 implemented in a 16 to 1 multiplex scheme, such as in a static random access memory (SRAM) design. Word lines and bit lines may be coupled to core arrays 302-308. Each core array 302-308 may include four columns of memory cells. The bit lines may pass from the core arrays 302-308 to multiplexors 310-316. Control lines entering the multiplexors 310-316 may determine a particular bit line pair corresponding to a column of memory cells that is to be sent to one of the sense amplifiers 100, 200, 318, and 320. Sense enable signals SEN0 116, SEN1 234, SEN2 322, and SEN3 324 may determine which sense amplifier output is sent to the MUX out lines 204, 206.

For example, control signals provided via the word lines, the bit lines, the control lines and the sense enable signals 116, 234, 322, and 324 may determine that data corresponding to a second column of memory cells of the core array 304 is to be sent from the multiplexor 312 to the sense amplifier 200 via the bit line pair 246, 248. The sense enable signal 234 may be in an enable state and the other enable signals 116, 322, and 324 may be in a disable state. The bit line pair 246, 248 may send data corresponding to the second column of the core array 304 to the sense amplifier 200. Inverters (e.g., the inverters 228, 230 of the sense amplifier 200 of FIG. 2) of the sense amplifier 200 may be powered by the sense enable signal 234 so that the MUX out lines 204, 206 receive output corresponding to the data of the bit line pair 246, 248.

Figure 4:
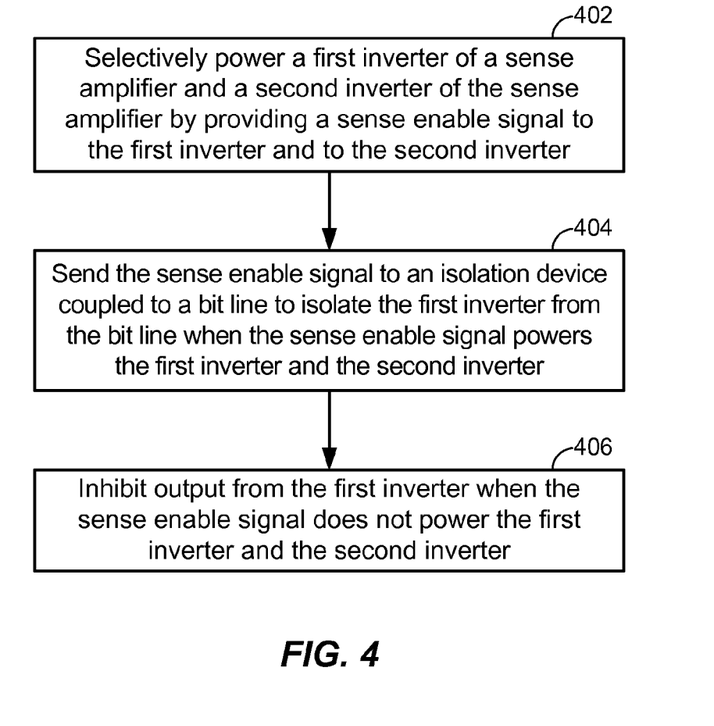
FIG. 4 is a flow chart diagram of a particular embodiment of a method of using a sense amplifier.

The other sense enable signals 116, 322, and 324 may each be in the disable state so that the inverters of the sense amplifiers 100, 318, and 320 that receive the other sense enable signals 116, 322, and 324 are not powered. The sense amplifiers 100, 318, and 320 are therefore isolated from the MUX out lines 204, 206. As a result, contention free operation of the MUX out lines 204, 206 may be achieved FIG. 4 depicts a flow chart of a particular embodiment of a method of using a sense amplifier. At 402, a first inverter of a sense amplifier and a second inverter of the sense amplifier are selectively powered by providing a sense enable signal to the first inverter and to the second inverter. The sense enable signal may be in an enable state or a disable state. When the sense enable signal is in the enable state, the sense enable signal powers the first inverter and the second inverter. When the sense enable signal is in the disable state, the sense enable signal does not power the first inverter and the second inverter. For example, the sense amplifier may be the sense amplifier 100 of FIG. 1.

At 404, the sense enable signal is sent to an isolation device coupled to a first bit line to isolate the first inverter from the first bit line when the sense enable signal powers the first inverter and the second inverter (i.e., when the sense enable signal is in the enable state). The sense enable signal may also be sent to a second isolation device coupled to a second bit line to isolate the second inverter from the second bit line when the sense enable signal powers the first inverter and the second inverter. For example, the isolation devices may be isolation devices 250, 252 of FIG. 2.

At 406, output from the first inverter is inhibited when the sense enable signal does not power the first inverter and the second inverter (i.e., when the sense enable signal is in the disable state). Output from the second inverter may also be inhibited when the sense enable signal does not power the first inverter and the second inverter. For example, the first inverter and the second inverter may generate complementary output values when the sense enable signal has a logical high value but may both output logical low values in response to the sense enable signal having a logical low value.

Using a sense enable signal of a sense amplifier to power the first inverter and the second inverter of the sense amplifier may enable the sense amplifier to be relatively small, fast, and reliable. For example, the sense amplifier may be implemented using fewer devices, smaller area, less coupling noise, less leakage, and/or better mismatch characteristics as compared to sense amplifiers that use not-or (NOR) circuits to block erroneous signals output by the sense amplifier. For example, a sense amplifier that uses the sense enable signal to power the first inverter and the second inverter of the sense amplifier may include four less devices than a sense amplifier that uses NOR circuits. In addition, low voltage threshold transistors may be used in the inverters of the sense amplifier without introducing leakage effects. Further, no additional components are added that may delay a switching path from the latch, enhancing switching speed as compared to conventional circuits.

The method of FIG. 4 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 4 can be performed by a memory controller having a processor that executes instructions, as described with respect to FIG. 5.

Figure 5:
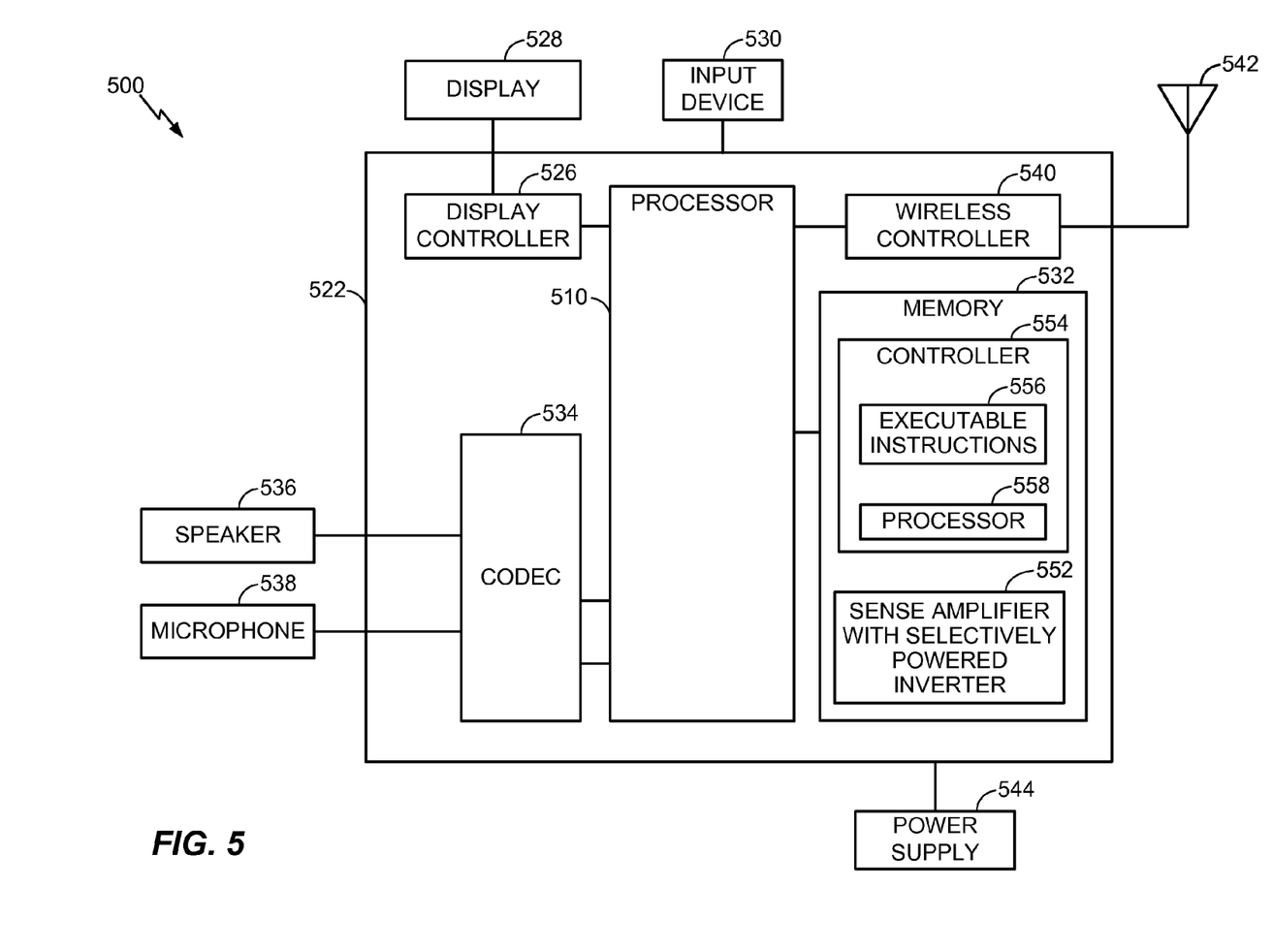
FIG. 5 is a block diagram of a particular embodiment of a communication device including a sense amplifier with a selectively powered inverter.

Referring to FIG. 5, a block diagram of a particular illustrative embodiment of an electronic device having a sense amplifier with a selectively powered inverter 552 is depicted and generally designated 500. The device 500 includes a processor, such as a digital signal processor (DSP) 510, coupled to a memory 532. The memory 532 includes the sense amplifier with the selectively powered inverter 552. In an illustrative embodiment, the sense amplifier with the selectively powered inverter 552 may correspond to the sense amplifier 100 of FIG. 1 and/or may operate according to the method of FIG. 4.

The memory 532 also includes a controller 554 including computer-executable instructions 556 that are stored at a non-transient computer-readable medium, such as a SRAM or read-only memory (ROM) at or accessible to the controller 554, as illustrative, non-limiting examples. For example, the executable instructions 556 may be executable by a computer, such as a processor 558 of the controller 554, to cause the computer (e.g. the processor 558) to selectively power a first inverter of the sense amplifier 552 and a second inverter of the sense amplifier 552 by providing a sense enable signal to the first inverter and to the second inverter. However, in other embodiments the sense enable signal may not be provided in response to a computer executing instructions and may instead be provided by operation of one or more state machines, dedicated circuitry, or other hardware configured to generate a sense enable signal to selectively power one or more inverters of the sense amplifier 552. Although the sense amplifier 552 is illustrated as within the memory 532, in other embodiments the sense amplifier 552 may be implemented in one or more other components, such as in the processor 510 or one or more other controllers or memory devices of the device 500.

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534.

FIG. 5 also indicates that a wireless controller 540 can be coupled to the processor 510 and to a wireless antenna 542. In a particular embodiment, the processor 510, the display controller 526, the memory 532, the CODEC 534, and the wireless controller 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the wireless antenna 542, and the power supply 544 are external to the system-on-chip device 522. However, each of the display 528, the input device 530, the speaker 536, the microphone 538, the wireless antenna 542, and the power supply 544 can be coupled to a component of the system-on-chip device 522, such as an interface or a controller.

In conjunction with the described embodiments, an apparatus is disclosed that includes means for inverting a first output of a latch, where the means for inverting the first output is powered by a sense enable signal, and means for inverting a second output of the latch, where the means for inverting the second output is powered by the sense enable signal. For example, the means for inverting the first output may include the inverter 120 coupled to the first latch output 126 of FIG. 1, the p-type transistor 240 of FIG. 2, the n-type transistor 242 of FIG. 2, one or more LVT devices, one or more other buffers or circuit devices configured to invert the first output, or any combination thereof. The means for inverting the second output may comprise the inverter 122 coupled to the second latch output 128 of FIG. 1, a p-type transistor, an n-type transistor, one or more LVT devices, one or more other buffers or circuit devices configured to invert the second output, or any combination thereof.

The apparatus can further include means for selectively isolating the first output of the latch from a first bit line, where the means for selectively isolating the first output is controlled by the sense enable signal. To illustrate, the means for selectively isolating the first output of the latch from the first bit line may include the isolation device 250 of FIG. 2, such as a p-type transistor, or any other type of transistor, switch, buffer or circuit device configured to selectively isolate the first output of the latch from the first bit line, or any combination thereof. The apparatus may be integrated in at least one semiconductor die and/or may further include a device selected from the group consisting of a set top box, a music player, a video player, an entertainment unit, a navigation device, a communications device, a personal digital assistant (PDA), a fixed location data unit, and a computer, into which the means for inverting the first output and the means for inverting the second output are integrated, as described with respect to FIG. 6.

Figure 6:
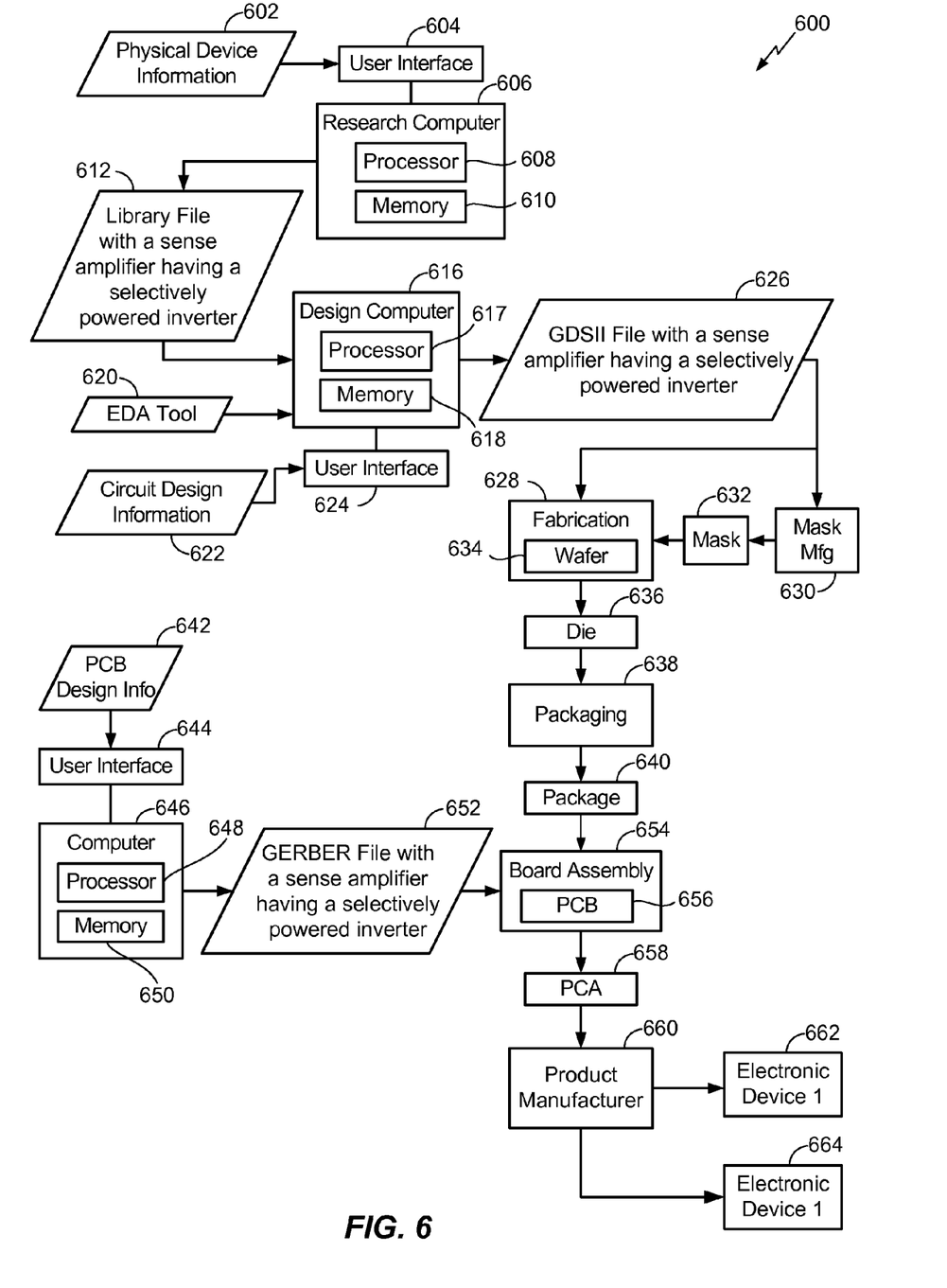
FIG. 6 is a flow diagram of a particular embodiment of a process to manufacture a device including a sense amplifier having a selectively powered inverter.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 6 depicts a particular illustrative embodiment of an electronic device manufacturing process 600.

Physical device information 602 is received at the manufacturing process 600, such as at a research computer 606. The physical device information 602 may include design information representing at least one physical property of a semiconductor device, such as the sense amplifier 100. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including a device that includes the sense amplifier 100 of FIG. 1 that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the sense amplifier 100 of FIG. 1 of the library file 612. For example, a user of the design computer 614 may enter circuit design information 622 via a user interface 624 coupled to the design computer 614. The circuit design information 622 may include design information representing at least one physical property of a semiconductor device, such as the sense amplifier 100. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the sense amplifier 100, in addition to other circuits or information. To illustrate, the data file may include information corresponding to a system-on-chip (SOC) that includes the sense amplifier 100 and that also includes additional electronic circuits and components within the SOC.

The GDSII file 626 may be received at a fabrication process 628 to manufacture the sense amplifier 100 according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 634, which may be tested and separated into dies, such as a representative die 636. The die 636 includes a circuit including a device that includes the sense amplifier 100.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the sense amplifier 100.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the sense amplifier 100. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), a fixed location data unit, and a computer, into which the sense amplifier 100 is integrated. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the sense amplifier 100 may be fabricated, processed, and incorporated into an electronic device, as described in the illustrative process 600. One or more aspects of the embodiments disclosed with respect to FIGS. 1-5 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A sense amplifier comprising:
   a first inverter responsive to a first output of a latch, wherein a source terminal of a first transistor of the first inverter is configured to receive a sense enable signal, and wherein a source terminal of a second transistor of the first inverter is connected to ground;
   a second inverter responsive to a second output of the latch, wherein a source terminal of a first transistor of the second inverter is configured to receive the sense enable signal, and wherein a source terminal of a second transistor of the second inverter is connected to ground; and
   a first isolation device responsive to the sense enable signal, wherein a drain terminal of the first isolation device is connected to the first output of the latch, wherein the first isolation device is connected to a first bit line and wherein the first isolation device is configured to isolate the first inverter from the first bit line when the source terminal of the first transistor of the first inverter receives the sense enable signal.

2. The sense amplifier of claim 1, wherein the first inverter comprises:
   a supply input that receives the sense enable signal; and
   an inverter input that receives the first output of the latch.

3. The sense amplifier of claim 2, wherein the first inverter comprises a p-type transistor and an n-type transistor serially coupled between the supply input and a ground.

4. The sense amplifier of claim 1, wherein the latch comprises a pair of cross-coupled inverters.

5. The sense amplifier of claim 1, wherein the first inverter comprises a plurality of low threshold voltage devices.

6. The sense amplifier of claim 1, wherein an output of the first inverter is coupled to an output stage.

7. The sense amplifier of claim 6, wherein the output stage comprises a multiplexor (MUX), and wherein the sense amplifier is configured to provide the output of the first inverter to the MUX in response to receiving the sense enable signal.

8. The sense amplifier of claim 6, wherein the output stage is controlled without use of a not-OR (NOR) circuit.

9. The sense amplifier of claim 6, wherein the output stage receives an output from at least one additional sense amplifier.

10. The sense amplifier of claim 6, wherein the output stage comprises a second multiplexor (MUX), and wherein the sense amplifier is configured to provide the output of the second inverter to the second MUX in response to receiving the sense enable signal.

11. The sense amplifier of claim 1, wherein the sense amplifier is a voltage-latched sense amplifier.

12. The sense amplifier of claim 1 integrated in at least one semiconductor die.

13. The sense amplifier of claim 1, further comprising at least one of: a set top box, a music player, a video player, an 14. A method comprising:
selectively powering a first inverter responsive to a first output of a latch of a sense amplifier by providing a sense enable signal to a source terminal of a first transistor of the first inverter, wherein a source terminal of a second transistor of the first inverter is connected to ground;
selectively powering a second inverter responsive to a second output of the latch of the sense amplifier by providing the sense enable signal to a source terminal of a first transistor of the second inverter, wherein a source terminal of a second transistor of the second inverter is connected to ground; and
sending the sense enable signal to a first isolation device connected to a bit line to isolate the first inverter from the bit line when the sense enable signal powers the first inverter and the second inverter.

15. The method of claim 14, further comprising inhibiting output from the sense amplifier when the sense enable signal does not power the first inverter and the second inverter.

16. An apparatus comprising:
a first sense amplifier comprising a first inverter responsive to a first output of a first latch and a second inverter responsive to a second output of the first latch, wherein a source terminal of a first transistor of the first inverter and a source terminal of a first transistor of the second inverter are configured to receive a first sense enable signal, and wherein a source terminal of a second transistor of the first inverter and a source terminal of a second transistor of the second inverter are connected to ground;
a first isolation device responsive to the first sense enable signal, wherein a drain terminal of the first isolation device is connected to a first output of the first latch, wherein the first isolation device is connected to a bit line, and wherein the first isolation device is configured to isolate the first inverter from the bit line when the source terminal of the first transistor of the first inverter receives the sense enable signal; and
a second sense amplifier comprising a third inverter responsive to a first output of a second latch and a fourth inverter responsive to a second output of the second latch, wherein a source terminal of a first transistor of the third inverter and a source terminal of a first transistor of the fourth inverter are configured to receive a second sense enable signal, and wherein a source terminal of a second transistor of the third inverter and a source terminal of a second transistor of the fourth inverter are connected to ground.

17. The apparatus of claim 16, wherein the first sense amplifier is coupled to a pair of bit lines.

18. The apparatus of claim 16, wherein the first sense amplifier comprises an inverter to generate the first sense enable signal.

19. The apparatus of claim 16, wherein the first sense amplifier comprises a voltage-latched sense amplifier.

20. The apparatus of claim 16, wherein the first inverter comprises a plurality of low threshold voltage devices.

21. The apparatus of claim 16, wherein power is not supplied to the first inverter and power is not supplied to the second inverter when the first sense enable signal indicates a disable state.

22. The apparatus of claim 16, wherein power is supplied to the first inverter and power is supplied to the second inverter when the first sense enable signal indicates an enable state.

23. The apparatus of claim 16 integrated in at least one semiconductor die.

24. The apparatus of claim 16, further comprising at least one of: a set top box, a music player, a video player, an entertainment unit, a navigation device, a communications device, a personal digital assistant (PDA), a fixed location data unit, or a computer, into which the first sense amplifier and the second sense amplifier are integrated.

25. An apparatus comprising:
means for inverting a first output of a latch, wherein a source terminal of a first transistor of the means for inverting the first output is configured to receive a sense enable signal, and wherein a source terminal of a second transistor of the means for inverting the first output is connected to ground;
means for inverting a second output of the latch, wherein a source terminal of a first transistor of the means for inverting the second output is configured to receive the sense enable signal, and wherein a source terminal of a second transistor of the means for inverting the second output is connected to ground; and
means for isolating the first output of the latch from a bit line responsive to the sense enable signal, wherein a drain terminal of the means for isolating the first output of the latch is connected to the first output of the latch, wherein the means for isolating is connected to the bit line, and wherein the means for isolating is configured to isolate the first output of the latch from the bit line when the source terminal of the first transistor of the means for inverting the first output of the latch receives the sense enable signal.

26. The apparatus of claim 25, wherein the means for inverting the first output of the latch comprises a plurality of low threshold voltage devices.

27. The apparatus of claim 25 integrated in at least one semiconductor die.

28. The apparatus of claim 25, further comprising at least one of: a set top box, a music player, a video player, an entertainment unit, a navigation device, a communications device, a personal digital assistant (PDA), a fixed location data unit, or a computer, into which the means for inverting the first output and the means for inverting the second output are integrated.

29. A method comprising:
a step for selectively powering a first inverter responsive to a first output of a latch of a sense amplifier by providing a sense enable signal to a source terminal of a first transistor of the first inverter, wherein a source terminal of a second transistor of the first inverter is connected to ground;
a step for selectively powering a second inverter responsive to a second output of the latch of the sense amplifier by providing the sense enable signal to a source terminal of a first transistor of the second inverter, wherein a source terminal of a second transistor of the second inverter is connected to ground; and
a step for sending the sense enable signal to a first isolation device connected to a first bit line to isolate the first inverter from the first bit line when the sense enable signal powers the first inverter and the second inverter.

30. The method of claim 29, wherein the step for selectively powering the first inverter and the step for selectively powering the second inverter are performed at a processor integrated into an electronic device.

31. A non-transitory computer readable medium storing instructions that, when executed by a processor, cause the processor to:
- selectively power a first inverter responsive to a first output of a latch of a sense amplifier by providing a sense enable signal to a source terminal of a first transistor of the first inverter, wherein a source terminal of a second transistor of the first inverter is connected to ground;
- selectively power a second inverter responsive to a second output of the latch of the sense amplifier by providing the sense enable signal to a source terminal of a first transistor of the second inverter, wherein a source terminal of a second transistor of the second inverter is connected to ground; and
- send the sense enable signal to a first isolation device connected to a first bit line to isolate the first inverter from the first bit line when the sense enable signal powers the first inverter and the second inverter.

32. The non-transitory computer readable medium of claim 31, wherein the instructions are executable by a processor integrated in at least one of: a set top box, a music player, a video player, an entertainment unit, a navigation device, a communications device, a personal digital assistant (PDA), a fixed location data unit, or a computer.

33. A method comprising:
receiving design information representing at least one physical property of a semiconductor device, the semiconductor device comprising:
- a first inverter responsive to a first output of a latch, wherein a source terminal of a first transistor of the first inverter is configured to receive a sense enable signal, and wherein a source terminal of a second transistor of the first inverter is connected to ground;
- a second inverter responsive to a second output of the latch, wherein a source terminal of a first transistor of the second inverter is configured to receive the sense enable signal, and wherein a source terminal of a second transistor of the second inverter is connected to ground; and
- a first isolation device responsive to the sense enable signal, wherein a drain terminal of the first isolation device is connected to the first output of the latch, wherein the first isolation device is connected to a first bit line, and wherein the first isolation device is configured to isolate the first inverter from the first bit line when the source terminal of the first transistor of the first inverter receives the sense enable signal;

transforming the design information to comply with a file format; and
generating a data file including the transformed design information.

34. The method of claim 33, wherein the data file includes a GDSII format.

35. The method of claim 33, wherein the data file includes a GERBER format.

36. The sense amplifier of claim 1, further comprising a second isolation device responsive to the sense enable signal, wherein a drain terminal of the second isolation device is connected to the second output of the latch.

37. The method of claim 14, further comprising sending the sense enable signal to a second isolation device connected to a second bit line to isolate the second inverter from the second bit line when the sense enable signal powers the first inverter and the second inverter.

38. The apparatus of claim 16, further comprising:
- a second isolation device responsive to the first sense enable signal, wherein a drain terminal of the second isolation device is connected to a second output of the first sense amplifier;
- a third isolation device responsive to the second sense enable signal, wherein a drain terminal of the third isolation device is connected to a first output of the second sense amplifier; and
- a fourth isolation device responsive to the second sense enable signal, wherein a drain terminal of the fourth isolation device is connected to a second output of the second sense amplifier.

39. The apparatus of claim 25, further comprising means for isolating the second output of the latch responsive to the sense enable signal, wherein a drain terminal of the means for isolating the second output of the latch is connected to the second output of the latch.

40. The method of claim 29, further comprising a step for sending the sense enable signal to a second isolation device connected to a second bit line to isolate the second inverter from the second bit line when the sense enable signal powers the first inverter and the second inverter.

41. The non-transitory computer readable medium of claim 31, wherein the instructions are further executable by the processor to send the sense enable signal to a second isolation device connected to a second bit line to isolate the second inverter from the second bit line when the sense enable signal powers the first inverter and the second inverter.

42. The method of claim 33, wherein the semiconductor device further comprises a second isolation device responsive to the sense enable signal, wherein a drain terminal of the second isolation device is connected to the second output of the latch.

* * * * *